US009322896B2

(12) United States Patent
Fielden et al.

(10) Patent No.: US 9,322,896 B2
(45) Date of Patent: Apr. 26, 2016

(54) SYSTEMS AND METHODS FOR REDUCED OFF-RESONANCE BLURRING IN SPIRAL IMAGING

(71) Applicants: Samuel W. Fielden, Charlottesville, VA (US); Craig H. Meyer, Charlottesville, VA (US); Xue Feng, Charlottesville, VA (US)

(72) Inventors: Samuel W. Fielden, Charlottesville, VA (US); Craig H. Meyer, Charlottesville, VA (US); Xue Feng, Charlottesville, VA (US)

(73) Assignee: University of Virginia Patent Foundation, Charlottesville, VA (US)

( * ) Notice: Subject to any disclaimer, the term of this patent is extended or adjusted under 35 U.S.C. 154(b) by 537 days.

(21) Appl. No.: 13/868,095

(22) Filed: Apr. 22, 2013

(65) Prior Publication Data

US 2014/0152304 A1 Jun. 5, 2014

Related U.S. Application Data

(60) Provisional application No. 61/636,551, filed on Apr. 20, 2012.

(51) Int. Cl.
*G01V 3/00* (2006.01)
*G01R 33/565* (2006.01)
*G01R 33/48* (2006.01)

(52) U.S. Cl.
CPC .......... *G01R 33/565* (2013.01); *G01R 33/4824* (2013.01)

(58) Field of Classification Search
CPC ................................................ G01R 33/56
USPC .......................................... 324/309, 307, 314
See application file for complete search history.

(56) References Cited

U.S. PATENT DOCUMENTS

| 4,999,580 | A | 3/1991 | Meyer et al. |
| 5,233,301 | A | 8/1993 | Meyer et al. |
| 5,402,067 | A | 3/1995 | Pauly et al. |
| 5,427,101 | A | 6/1995 | Sachs et al. |
| 5,485,086 | A | 1/1996 | Meyer et al. |
| 5,539,313 | A | 7/1996 | Meyer |
| 5,617,028 | A | 4/1997 | Meyer et al. |
| 5,650,723 | A | 7/1997 | Meyer |

(Continued)

OTHER PUBLICATIONS

Chen, W. et al., "Fast conjugate phase image reconstruction based on a Chebyshev approximation to correct for B0 field inhomogeneity and concomitant gradients," Magn Reson Med., 2008, pp. 1104-1111, 60(5), Wiley-Liss, Inc.

(Continued)

*Primary Examiner* — Louis Arana
(74) *Attorney, Agent, or Firm* — Troutman Sanders LLP; Ryan A. Schneider; Christopher W. Glass

(57) ABSTRACT

Systems, methods of reducing off-resonance blurring in acquired magnetic resonance imaging data. The method includes acquiring a first set of spiral interleaf data for each of one or more spiral-in/out interleaves by performing a first sampling each of one or more locations in k-space along a first redundant spiral-in/out trajectory, and acquiring a second set of spiral interleaf data for each of the one or more spiral-in/out interleaves by performing a second sampling of each of the one or more locations in the k-space along a second redundant spiral-in/out trajectory, wherein the second redundant spiral-in/out trajectory corresponds to a time-reversed trajectory of the first redundant spiral-in/out trajectory. The method may yet further include combining the first set of spiral interleaf data and the second set of spiral interleaf data with an averaging operation such as to reduce artifacts.

24 Claims, 13 Drawing Sheets

(56) References Cited

U.S. PATENT DOCUMENTS

| | | | |
|---|---|---|---|
| 5,957,843 | A | 9/1999 | Luk Pak et al. |
| 6,020,739 | A | 2/2000 | Meyer et al. |
| 7,348,776 | B1 * | 3/2008 | Aksoy et al. .......... 324/307 |
| 7,558,612 | B2 | 7/2009 | Meyer |
| 7,583,082 | B1 | 9/2009 | Hu et al. |
| 7,642,777 | B1 | 1/2010 | Meyer et al. |
| 7,888,935 | B1 | 2/2011 | Tan et al. |
| 2003/0193337 | A1 | 10/2003 | Meyer |
| 2012/0243756 | A1 * | 9/2012 | Samsonov et al. .......... 382/131 |
| 2015/0126850 | A1 * | 5/2015 | Cetingul et al. .......... 600/413 |

OTHER PUBLICATIONS

Feng, X. et al., "Comparison Among Radial, Spiral-Out and Spiral-In/Out BSSFP in Real Time Cardiac Imaging," Proc. Intl. Soc. Mag. Reson Med., 2011, 19, p. 2620.

Fielden, S. et al., "Variable-flip angle 3D-turbo spin echo imaging utilizing spiral acquisitions" Proc. Intl. Soc. Mag. Reson Med., 2011, 19, p. 2820.

Glover, G. et al., "Improved Combination of Spiral-In/Out Images for BOLD fMRI," Magn Reson Med., 2004, pp. 863-868, 51, Wiley-Liss, Inc.

Glover, G., "Spiral Imaging in fMRI," NeuroImage, 2012, pp. 706-712, 62(2), Elsevier Inc.

King, K. et al., "Concomitant Gradient Field Effects in Spiral Scans," Magn Reson Med., 1999, pp. 103-112, 41(1), Wiley-Liss, Inc.

Meyer, C., "Rapid Magnetic Resonance Imaging," PhD Thesis, Stanford University, 2000.

Sica, C., "Concomitant gradient field effects in spiral scanning and balanced SSFP scanning," PhD Thesis, University of Virginia, 2008.

* cited by examiner

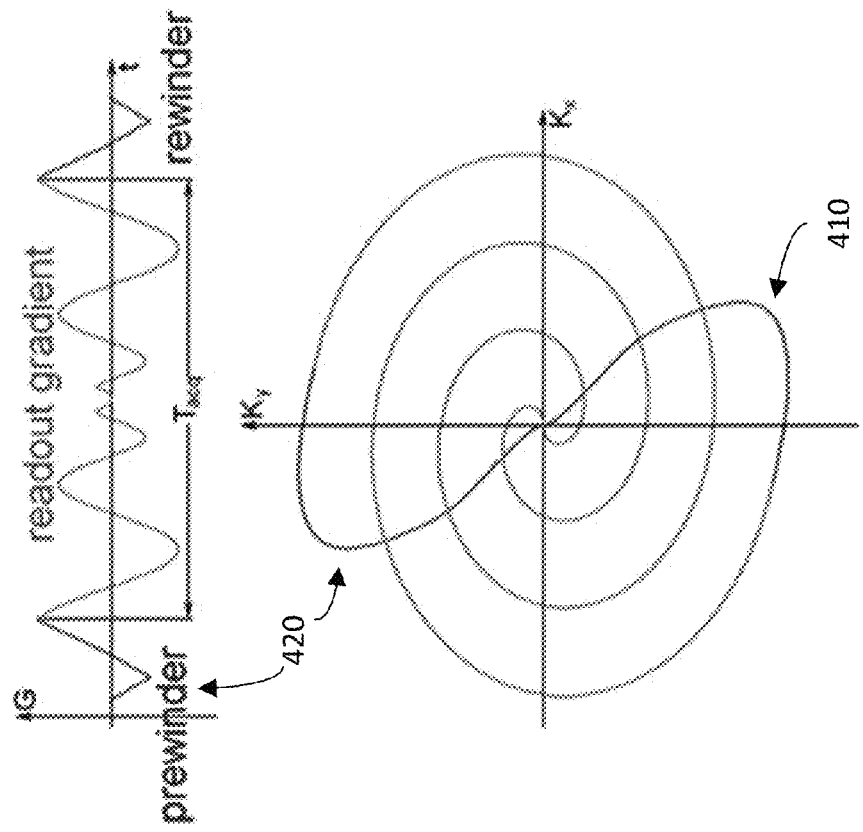
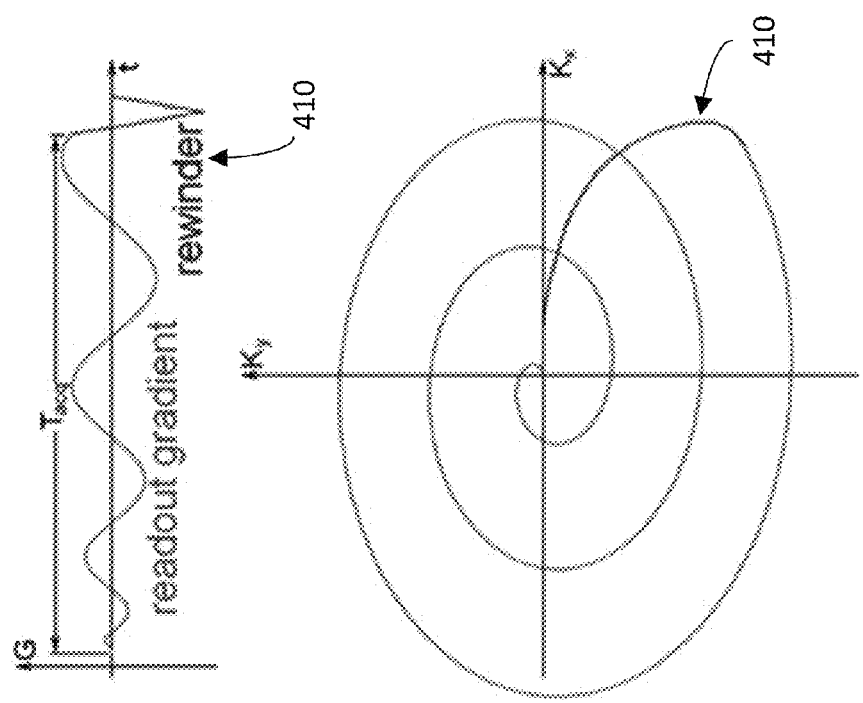

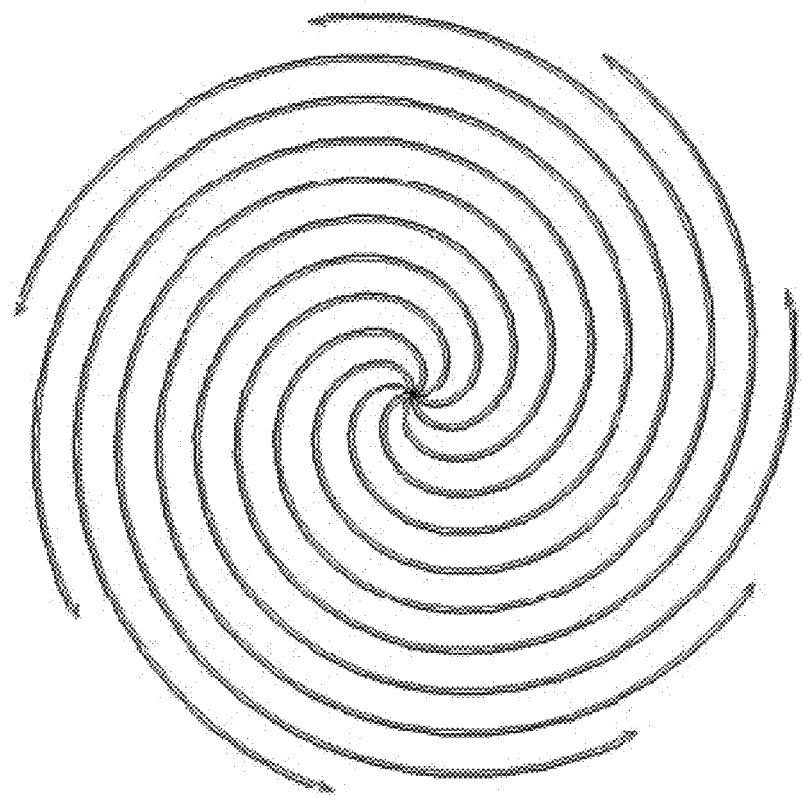
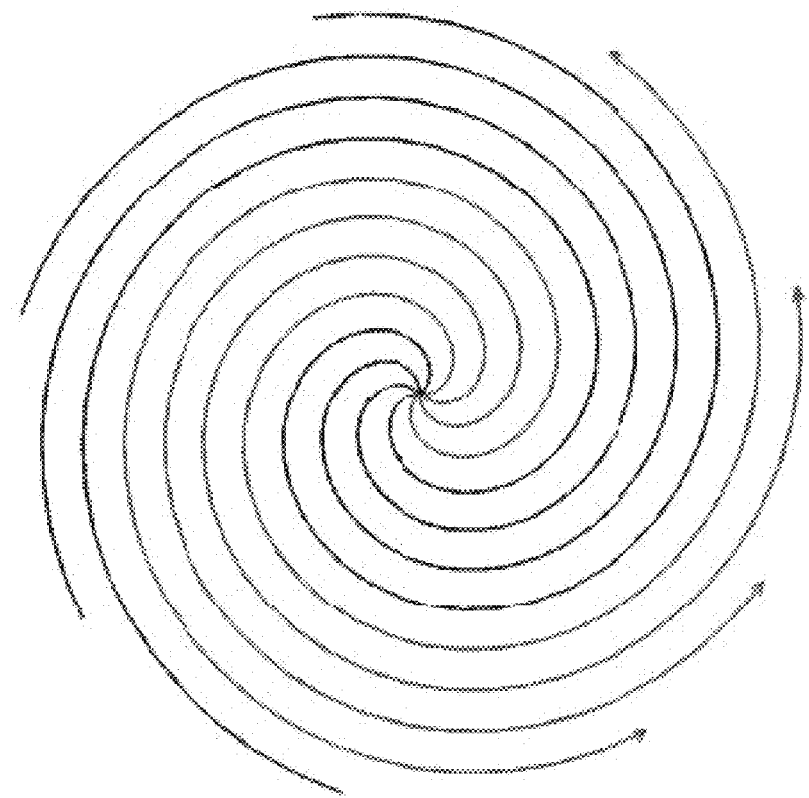

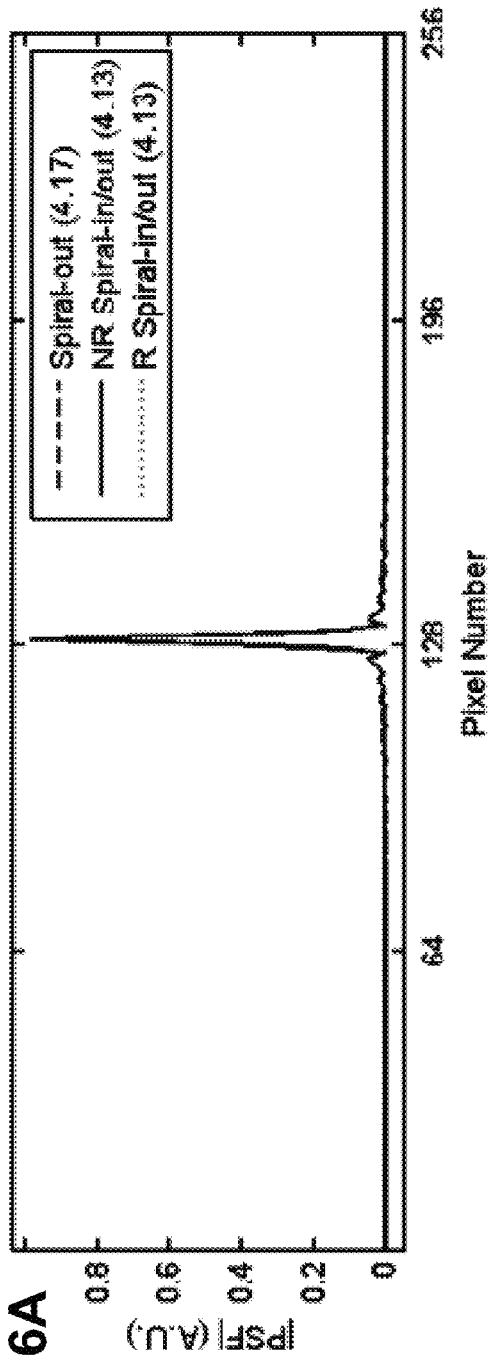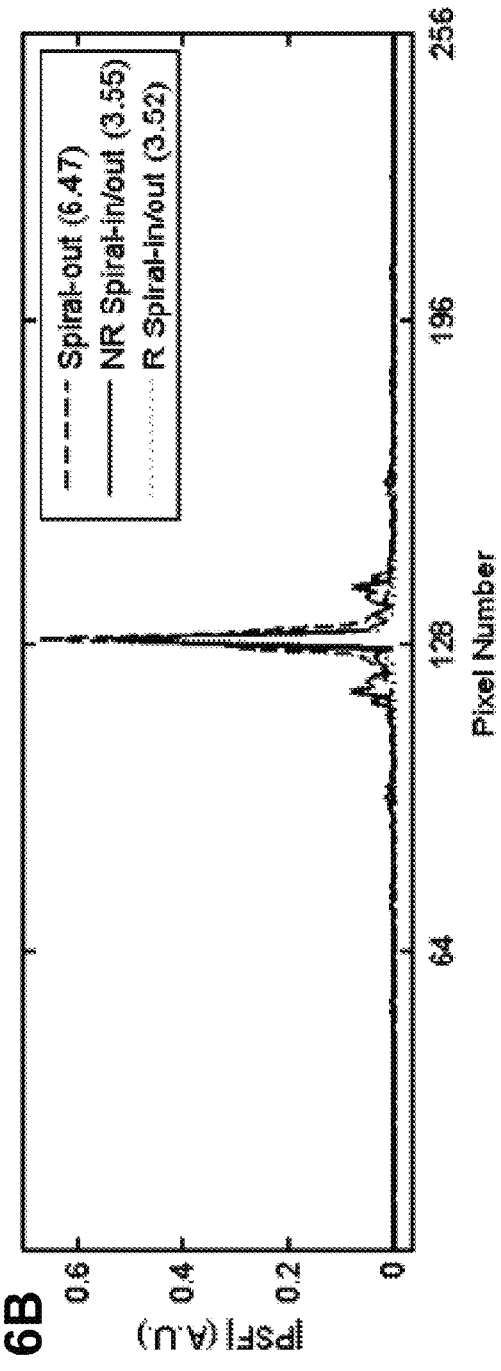
FIG. 6A
FIG. 6B

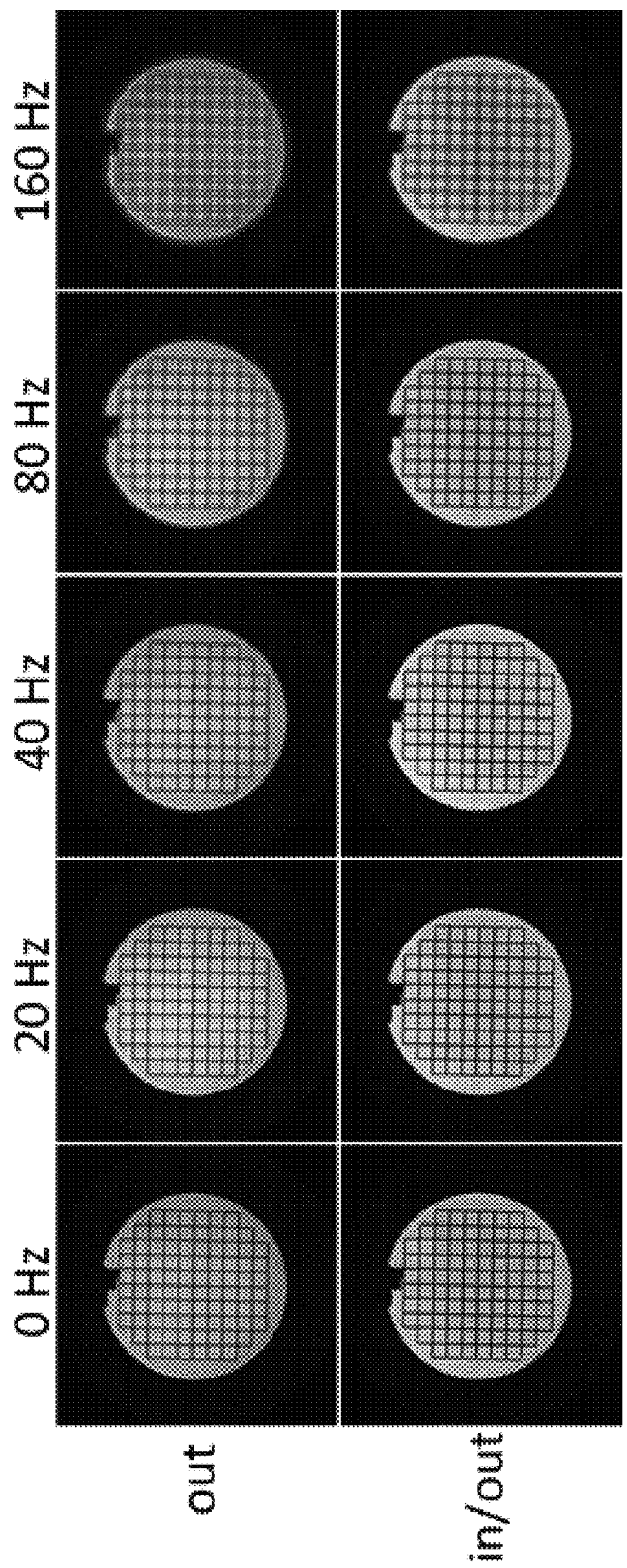

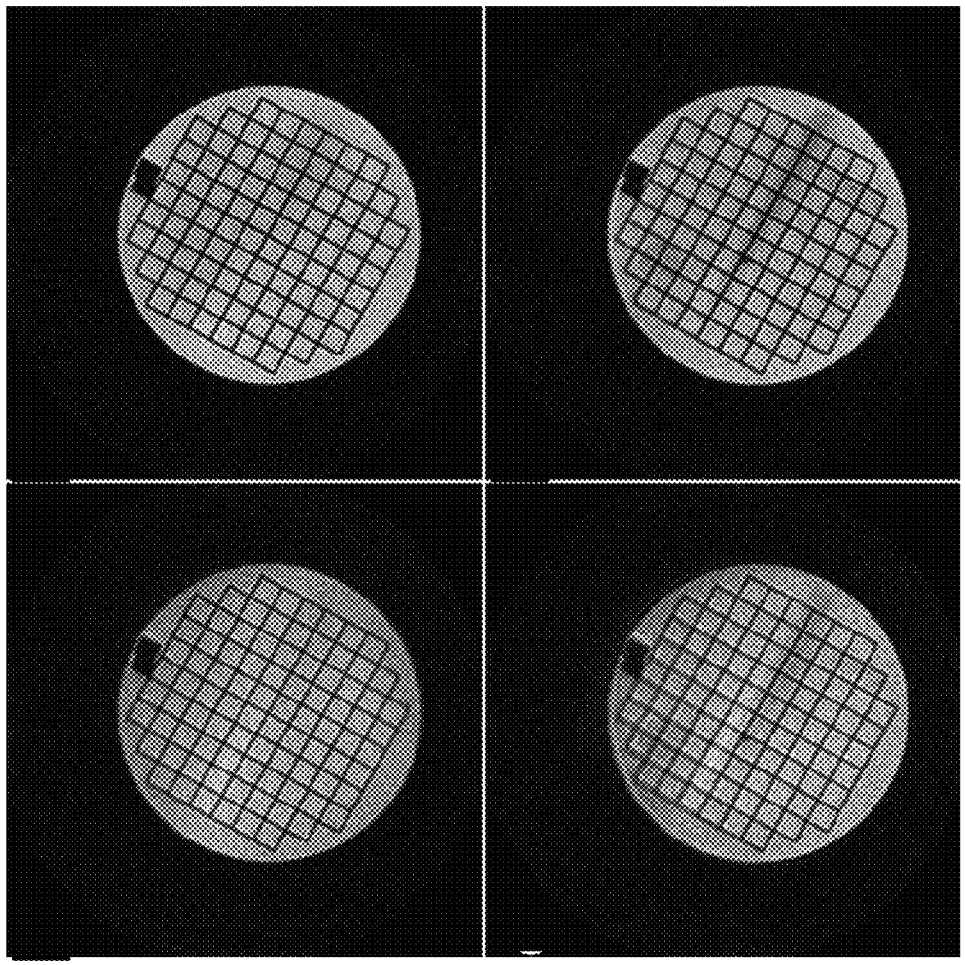

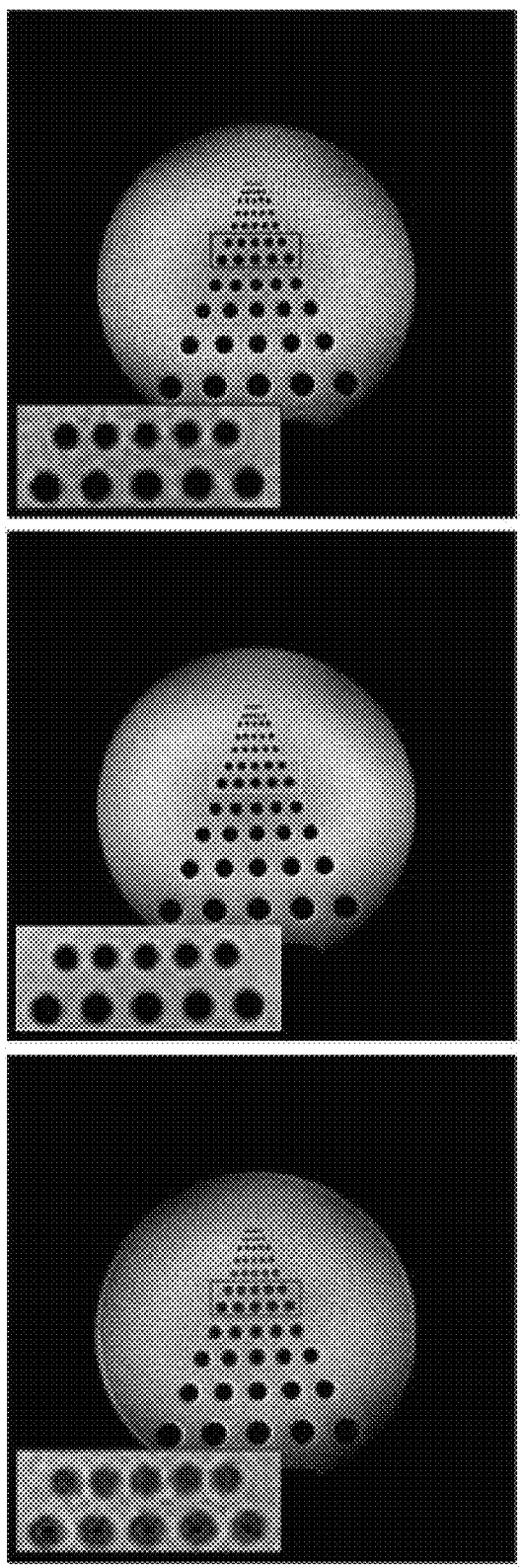

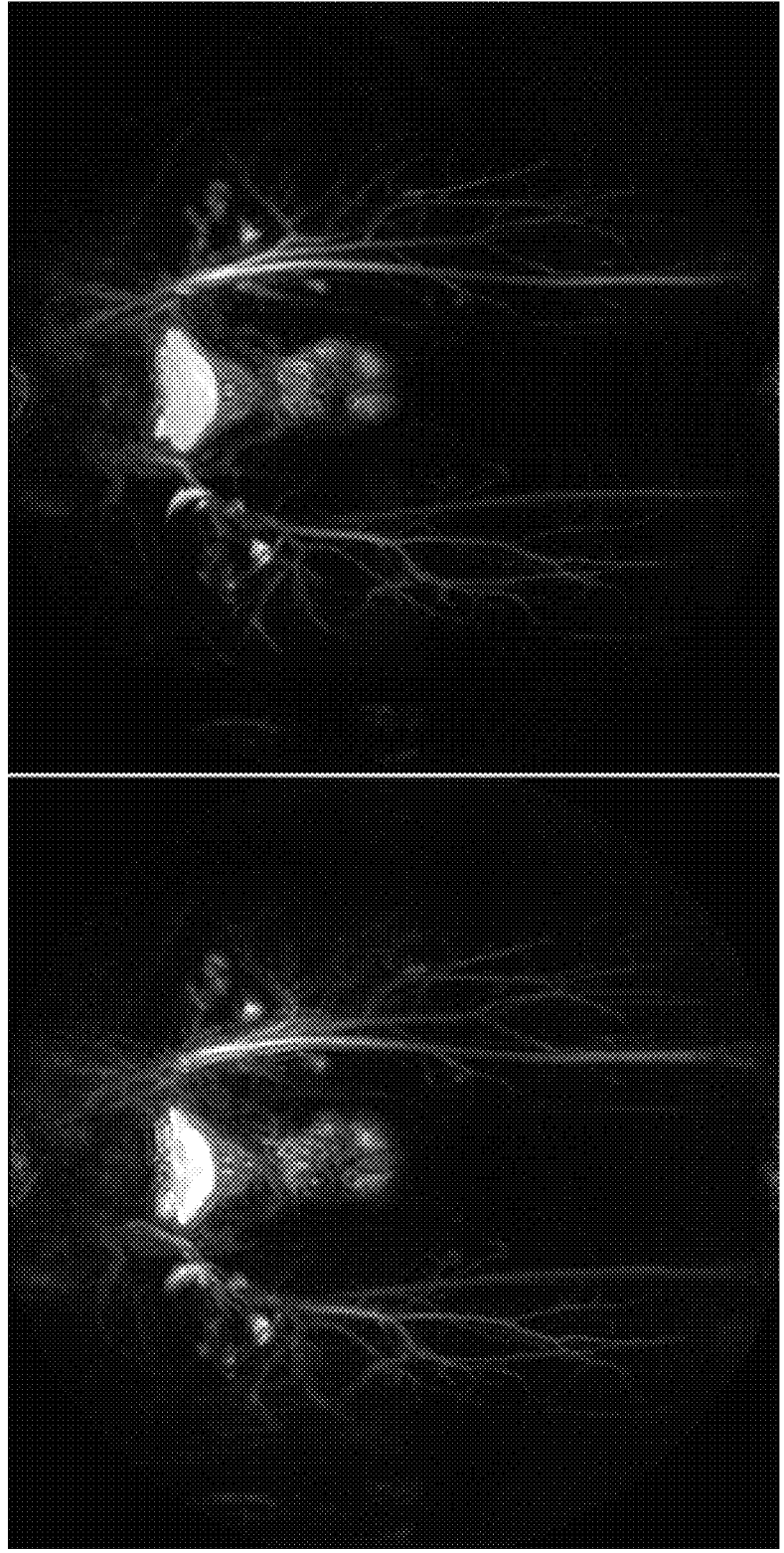

SYSTEMS AND METHODS FOR REDUCED OFF-RESONANCE BLURRING IN SPIRAL IMAGING

CROSS-REFERENCE TO RELATED APPLICATIONS

This Application claims priority to and benefit under 35 U.S.C. §119(e) of U.S. Provisional Patent Application Ser. No. 61/636,551, entitled "Simple Acquisition Strategy to Avoid Off-Resonance Blurring in Spiral Imaging", filed Apr. 20, 2012, which is hereby incorporated by reference as if fully set forth below.

Some references, which may include patents, patent applications, and various publications, are cited in a reference list and discussed in the disclosure provided herein. The citation and/or discussion of such references is provided merely to clarify the description of the present disclosure and is not an admission that any such reference is "prior art" to any aspects of the present disclosure described herein. All references cited and discussed in this specification are incorporated herein by reference in their entireties and to the same extent as if each reference was individually incorporated by reference. In terms of notation, hereinafter, "[n]" represents the nth reference cited in the reference list. For example, [4] represents the 4th reference cited in the reference list, namely, Noll et al., "A homogeneity correction method for magnetic resonance imaging with time-varying gradients." IEEE T Med Imaging 10:629-637 (1991).

STATEMENT OF RIGHTS UNDER FEDERALLY-SPONSORED RESEARCH

This invention was made with government support under grant HL079110, awarded by the National Institutes of Health. The government has certain rights in the invention.

BACKGROUND

Spiral k-space trajectories offer many advantages over traditional rectilinear acquisitions, including improved acquisition efficiency, less stringent hardware requirements, and natural resilience to flow and motion. However, a major hurdle to wide-spread adoption of spiral trajectories has been their poor off-resonance performance. Efforts to correct or at least mitigate the resultant blurring have resulted in lengthy algorithms often requiring several seconds to reconstruct a single image. It is with respect to these and other considerations that the various embodiments described below are presented.

SUMMARY

The present disclosure relates generally to magnetic resonance imaging (MRI) and, more particularly, systems, methods, and computer program products for reduced off-resonance blurring in spiral imaging. In one aspect, the present disclosure relates to a method of acquiring magnetic resonance imaging (MRI) data associated with an area of interest of a subject. In one example embodiment, the method includes acquiring a first set of spiral interleaf data for each of one or more spiral-in/out interleaves by performing a first sampling each of one or more locations in k-space along a first redundant spiral-in/out trajectory. The method may further include acquiring a second set of spiral interleaf data for each of the one or more spiral-in/out interleaves by performing a second sampling of each of the one or more locations in the k-space along a second redundant spiral-in/out trajectory. The second redundant spiral-in/out trajectory may correspond to a time-reversed trajectory of the first redundant spiral-in/out trajectory. The method may yet further include combining the first set of spiral interleaf data and the second set of spiral interleaf data with an averaging operation such as to reduce artifacts.

In another aspect, the present disclosure relates to a system. In one example embodiment, the system includes a magnetic resonance imaging (MRI) device, one or more processors, and at least one memory device in communication with the MRI device. The memory device stores computer-readable instructions that, when executed by the one or more processors, cause the system to perform functions that include acquiring a first set of spiral interleaf data, by the MRI device, for each of one or more spiral-in/out interleaves by performing a first sampling each of one or more locations in k-space along a first redundant spiral-in/out trajectory. The method may further include acquiring a second set of spiral interleaf data for each of the one or more spiral-in/out interleaves by performing a second sampling of each of the one or more locations in the k-space along a second redundant spiral-in/out trajectory. The second redundant spiral-in/out trajectory may correspond to a time-reversed trajectory of the first redundant spiral-in/out trajectory. The functions may yet further include combining, by the one or more processors, the first set of spiral interleaf data and the second set of spiral interleaf data with an averaging operation such as to reduce artifacts.

In yet another aspect, the present disclosure relates to a computer-readable storage medium. In one example embodiment, the computer-readable medium has stored computer-executable instructions that, when executed by one or more processors, cause a computer to perform functions that include acquiring a first set of spiral interleaf data for each of one or more spiral-in/out interleaves by performing a first sampling each of one or more locations in k-space along a first redundant spiral-in/out trajectory. The functions may further include acquiring a second set of spiral interleaf data for each of the one or more spiral-in/out interleaves by performing a second sampling of each of the one or more locations in the k-space along a second redundant spiral-in/out trajectory. The second redundant spiral-in/out trajectory may correspond to a time-reversed trajectory of the first redundant spiral-in/out trajectory. The functions may yet further include combining the first set of spiral interleaf data and the second set of spiral interleaf data with an averaging operation such as to remove artifacts.

Other aspects and features according to the present disclosure will become apparent to those of ordinary skill in the art, upon reviewing the following detailed description in conjunction with the accompanying figures.

BRIEF DESCRIPTION OF THE DRAWINGS

FIGS. 4A-B illustrate spiral-out and spiral-in/out read gradients, respectively, in accordance with one example embodiment of the present disclosure.

FIGS. 4C-D illustrate k-space trajectories for spiral out and spiral-in/out trajectories, respectively, in accordance with one example embodiment of the present disclosure.

FIGS. 5A-B illustrate spiral in arms and spiral out arms for non-redundant and redundant spiral-in/out trajectories, respectively, in accordance with one example embodiment of the present disclosure. Each of these trajectories is spiral-in/out, but for ease of visualization, blue lines represent spiral-in arms of the trajectories; red represents spiral-out.

FIGS. 6A-B illustrate point-spread-functions (PSF) for spiral-out, non-redundant spiral-in/out, and redundant spiral-in/out trajectory variations, in accordance with one example embodiment of the present disclosure. Center line of 2D PSF is shown for each trajectory variation. Numbers in parentheses are FWTM values for each trajectory. In FIG. 6A, on-resonance, PSFs are nearly indistinguishable. In FIG. 6B, 50 Hz off-resonance (0.5 cycles of phase accrued by the end of the readout), the spiral-out trajectory shows expected broadening; The non-redundant spiral-in/out shows narrow main lobe along with very pronounced side lobe "rings"; and the redundant spiral-in/out removes these rings, leaving the narrow main lobe.

FIG. 7A shows center-frequency offset. Until ~0.5 cycles of phase are accrued, the cosine function never reaches its first zero, resulting in a relatively benign amplitude modulation in k-space; however, important frequencies are lost as the amount of off-resonance increases. FIG. 7B shows off-resonance due to concomitant fields. MTFs for off-resonance due to concomitant fields show good performance can be expected up to about 1 cycle of accrued phase. FIG. 7C shows the effect of decay during the readout. Differing amounts of $T_2$ decay were simulated with 0.5 cycles of off-resonance phase accrual. Severe shaping of the MTF is only seen when the T2 time constant approaches the readout length (10 ms)

FIG. 9 illustrates phantom images at various amounts of off-resonance for spiral out and spiral-in/out trajectories, in accordance with one example embodiment of the present disclosure. The top row shows spiral-out, the bottom row shows spiral-in/out. No off-resonance correction was applied. Images were acquired with a 10 ms readout, resulting in cycles of phase accumulated at the end of the readout: 0 Hz=0 cycles, 20 Hz=0.2 cycles, 40 Hz=0.4 cycles, 80 Hz=0.8 cycles, 160 Hz=1.6 cycles FIGS. 10A-D illustrate trajectory performance in the presence of concomitant fields for spiral-out at isocenter, spiral-in/out at isocenter, spiral-out off center, and spiral-in/out off center. FIG. 10A shows spiral-out at isocenter. FIG. 10B shows spiral-in/out at isocenter. FIG. 10C shows spiral-out off-center. Note the blurring near the top of the phantom due to concomitant fields. FIG. 10D shows spiral-in/out off-center. The blurring due to concomitant fields is reduced.

FIG. 11A-C illustrate a slice from a 3D stack-of-spiral sequence for spiral-out, redundant spiral-in/out, and combined redundant spiral-in/out acquisitions, respectively.

In FIG. 12A, significant blurring may be observed in areas with poor homogeneity (insets). In FIG. 12B, improved off-resonance performance is obtained with little to no increase in scan time.

FIGS. 13A-B illustrate spiral out and redundant spiral-in/out acquisitions, respectively, for non-contrast MRA in a volunteer with no off-resonance correction applied. In FIG. 12A, blurring may be observed near the femoral bifurcation as well as more distally. In FIG. 12B, improved sharpness of the femoral artery may be observed.

DETAILED DESCRIPTION

Figure 1:
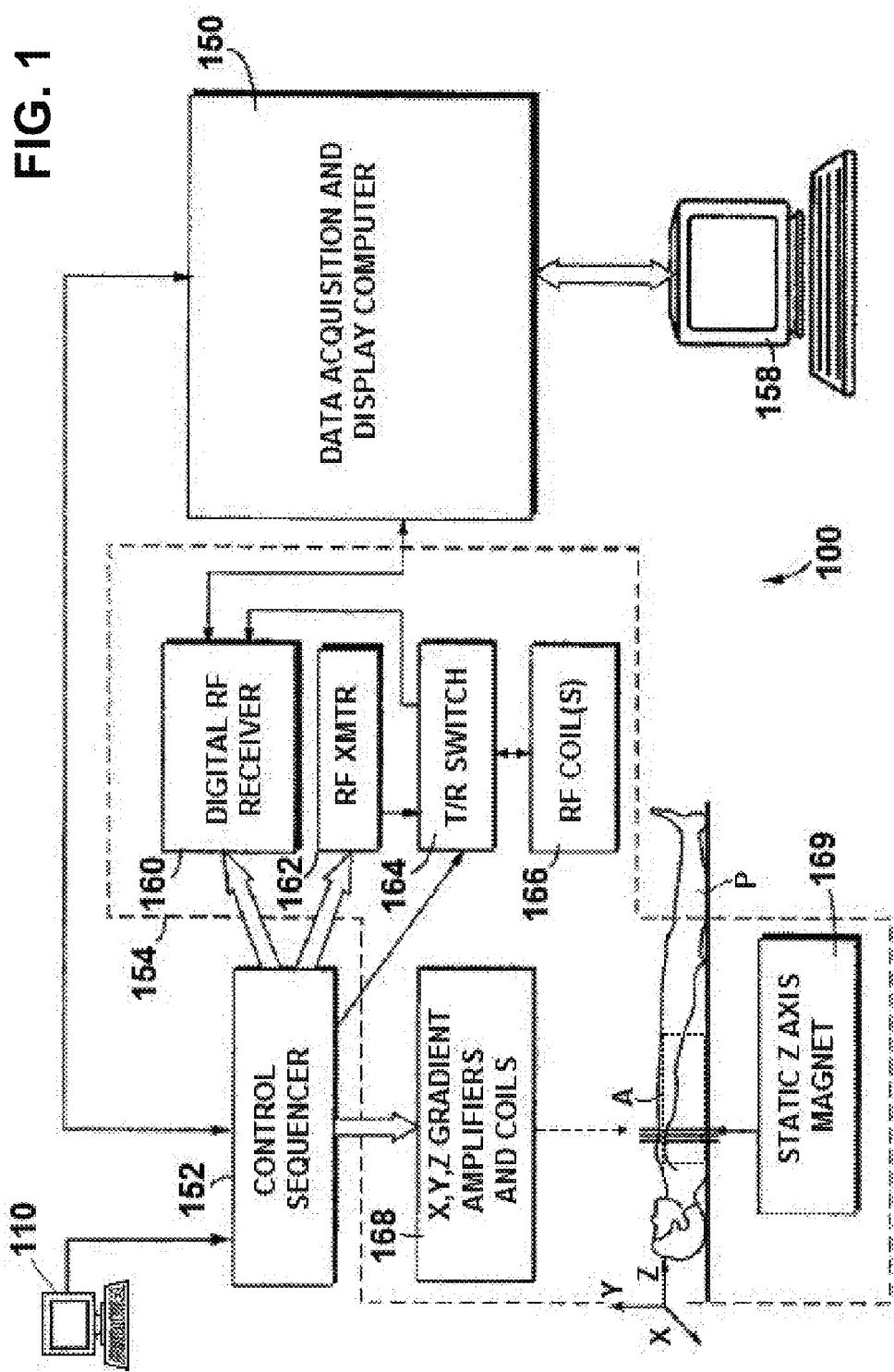
FIG. 1 is a system diagram illustrating an operating environment capable of implementing aspects of the present disclosure in accordance with one or more example embodiments.

Embodiments of the disclosed technology relate generally to magnetic resonance imaging (MRI) and, more particularly, to systems and methods for reduced off resonance blurring in spiral imaging. Some embodiments of the disclosed technology may use a self-correcting spiral trajectory that may reduce much of the well-known spiral blurring during data acquisition. In comparison with a traditional spiral-out trajectory, the disclosed spiral-in/out trajectory may provide improved off-resonance performance. In an example embodiment, by combining two spiral-in/out acquisitions (e.g., one rotated 180° in k-space compared to the other) multi-shot spiral-in/out artifacts may be reduced significantly.

Although example embodiments of the present disclosure are explained in detail, it is to be understood that other embodiments are contemplated. Accordingly, it is not intended that the present disclosure be limited in its scope to the details of construction and arrangement of components set forth in the following description or illustrated in the drawings. The present disclosure is capable of other embodiments and of being practiced or carried out in various ways.

It must also be noted that, as used in the specification and the appended claims, the singular forms "a," "an" and "the" include plural referents unless the context clearly dictates otherwise.

In describing example embodiments, terminology will be resorted to for the sake of clarity. It is intended that each term contemplates its broadest meaning as understood by those skilled in the art and includes all technical equivalents that operate in a similar manner to accomplish a similar purpose.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

Ranges may be expressed herein as from "about" or "approximately" one particular value and/or to "about" or "approximately" another particular value. When such a range is expressed, another embodiment includes from the one particular value and/or to the other particular value. As used herein, "about" means within 20 percent or closer of a given value or range.

As discussed herein, a "subject" or "patient" may be a human or any animal. It should be appreciated that an animal may be a variety of any applicable type, including, but not limited thereto, mammal, veterinarian animal, livestock animal or pet type animal, etc. As an example, the animal may be a laboratory animal specifically selected to have certain characteristics similar to a human (e.g. rat, dog, pig, monkey), etc. It should be appreciated that the subject may be any applicable human patient, for example.

It is also to be understood that the mention of one or more steps of a method does not preclude the presence of additional method steps or intervening method steps between those steps expressly identified. Steps of a method may be performed in a different order than those described herein. Similarly, it is also to be understood that the mention of one or more components in a device or system does not preclude the presence of additional components or intervening components between those components expressly identified.

The following detailed description is directed to systems and methods for reduced off-resonance blurring in spiral imaging In the following detailed description, references are made to the accompanying drawings that form a part hereof and that show, by way of illustration, specific embodiments or examples. In referring to the drawings, like numerals represent like elements throughout the several figures.

FIG. 1 is a system diagram illustrating an operating environment capable of implementing aspects of the present disclosure in accordance with one or more example embodiments. Embodiments may be implemented on a commercial MRI system. FIG. 1 illustrates an example of such an MRI system 100, including a data acquisition and display computer 150 coupled to an operator console 110, a MRI real-time control sequencer 152, and a MRI subsystem 154. The MRI subsystem 154 may include XYZ magnetic gradient coils and associated amplifiers 168, a static Z-axis magnet 169, a digital RF transmitter 162, a digital RF receiver 160, a transmit/receive switch 164, and RF coil(s) 166. The MRI subsystem 154 may be controlled in real time by control sequencer 152 to generate magnetic and radio frequency fields that stimulate magnetic resonance phenomena in a living subject, patient P, to be imaged. A contrast-enhanced image of an area of interest A of the patient P may be shown on display 158.

The area of interest A corresponds to a region associated with one or more physiological activities in patient P. The area of interest shown in the example embodiment of FIG. 1 corresponds to a chest region of patient P. It will be appreciated that area of interest A can additionally or alternatively correspond to, but is not limited to, one or more of a brain region, cardiac region, and upper or lower limb regions of the patient P. Display 158 may be implemented through a variety of output interfaces, including a monitor, printer, or data storage. It will be appreciated that any number and type of computer-based tomography imaging systems or components, including various types of magnetic resonance imaging systems, may be used to practice aspects of the present disclosure, and the disclosure should not be limited to the type of MRI subsystem shown in FIG. 1.

Figure 2:
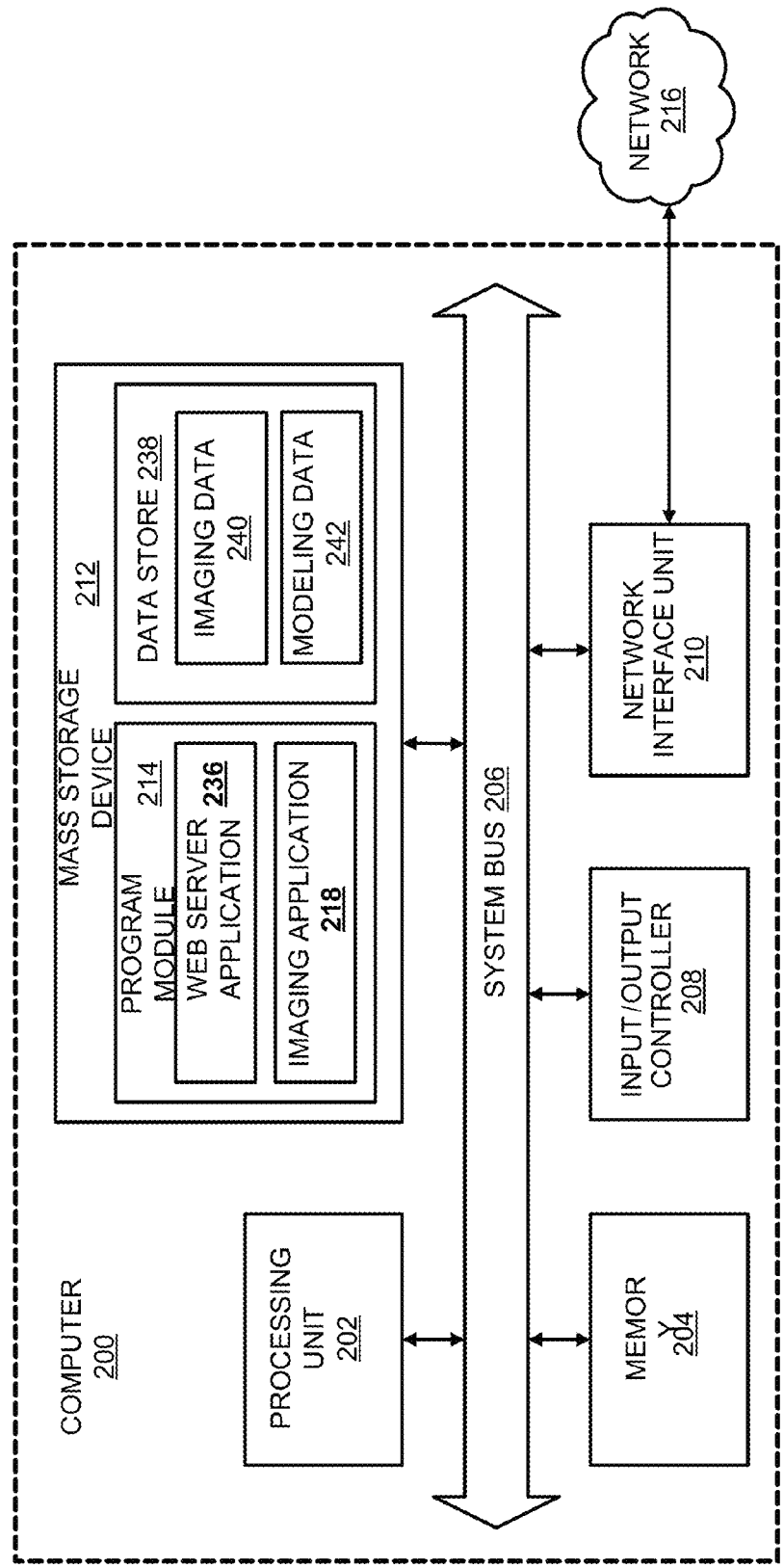
FIG. 2 is a computer architecture diagram showing illustrative computer hardware architecture for a computing system capable of implementing aspects of the present disclosure in accordance with one or more example embodiments.

FIG. 2 is a computer architecture diagram showing illustrative computer hardware architecture for a computing system capable of implementing aspects of the present disclosure in accordance with one or more example embodiments described herein. An example implementation of the computer 200 may include the data acquisition and display computer 150 of FIG. 1. The computer 200 includes a processing unit 202 ("CPU"), a system memory 204, and a system bus 206 that couples the memory 204 to the CPU 202. The computer 200 further includes a mass storage device 212 for storing program modules 214. The program modules 214 may be operable to perform various operations discussed below with respect to FIGS. 3-13 and may include a web server application 236 and an imaging application 218. The computer can include a data store 238 for storing data that may include imaging-related data 240 such as image acquisition data, and a modeling data store 242 for storing image modeling data, or other various types of data utilized in practicing aspects of the present disclosure.

The mass storage device 212 is connected to the CPU 202 through a mass storage controller (not shown) connected to the bus 206. The mass storage device 212 and its associated computer-storage media provide non-volatile storage for the computer 200. Although the description of computer-storage media contained herein refers to a mass storage device, such as a hard disk or CD-ROM drive, it should be appreciated by those skilled in the art that computer-storage media can be any available computer storage media that can be accessed by the computer 200.

By way of example, and not limitation, computer-storage media may include volatile and non-volatile, removable and non-removable media implemented in any method or technology for storage of information such as computer-storage instructions, data structures, program modules, or other data. For example, computer storage media includes, but is not limited to, RAM, ROM, EPROM, EEPROM, flash memory or other solid state memory technology, CD-ROM, digital versatile disks ("DVD"), HD-DVD, BLU-RAY, or other optical storage, magnetic cassettes, magnetic tape, magnetic disk storage or other magnetic storage devices, or any other medium which can be used to store the desired information and which can be accessed by the computer 200.

According to various embodiments, the computer 200 may operate in a networked environment using logical connections to remote computers through a network 216. The computer 200 may connect to the network 216 through a network interface unit 210 connected to the bus 206. It should be appreciated that the network interface unit 210 may also be utilized to connect to other types of networks and remote computer systems. The computer 200 may also include an input/output controller 208 for receiving and processing input from a number of input devices. The bus 206 may enable the processing unit 202 to read code and/or data to/from the mass storage device 212 or other computer-storage media. The computer-storage media may represent apparatus in the form of storage elements that are implemented using any suitable technology, including but not limited to semiconductors, magnetic materials, optics, or the like.

The computer-storage media may represent memory components, whether characterized as RAM, ROM, flash, or other types of technology. The computer-storage media may also represent secondary storage, whether implemented as hard drives or otherwise. Hard drive implementations may be characterized as solid state, or may include rotating media storing magnetically-encoded information. The program modules 214, which include the imaging application 218, may include software instructions that, when loaded into the processing unit 202 and executed, cause the computer 200 to provide functions for accelerated arterial spin labeling (ASL) using compressed sensing, according to aspects of the present disclosure described herein in accordance with example embodiments. The program modules may also provide various tools or techniques by which the computer 200 may participate within the overall systems or operating environments using the components, flows, and data structures discussed throughout this description.

In general, the program modules 214 may, when loaded into the processing unit 202 and executed, transform the processing unit 202 and the overall computer 200 from a general-purpose computing system into a special-purpose computing system. The processing unit 202 may be constructed from any number of transistors or other discrete circuit elements, which may individually or collectively assume any number of states. More specifically, the processing unit 202 may operate as a finite-state machine, in response to executable instructions contained within the program modules 214. These computer-executable instructions may transform the processing unit 202 by specifying how the processing unit 202 transitions between states, thereby transforming the transistors or other discrete hardware elements constituting the processing unit 202.

Encoding the program modules 214 may also transform the physical structure of the computer-storage media. The specific transformation of physical structure may depend on various factors, in different implementations of this description. Examples of such factors may include, but are not limited to the technology used to implement the computer-storage media, whether the computer storage media are characterized as primary or secondary storage, and the like. For example, if the computer-storage media are implemented as semiconductor-based memory, the program modules 214 may transform the physical state of the semiconductor memory, when the software is encoded therein. For example, the program modules 214 may transform the state of transistors, capacitors, or other discrete circuit elements constituting the semiconductor memory.

As another example, the computer-storage media may be implemented using magnetic or optical technology. In such implementations, the program modules 214 may transform the physical state of magnetic or optical media, when the software is encoded therein. These transformations may include altering the magnetic characteristics of particular locations within given magnetic media. These transformations may also include altering the physical features or characteristics of particular locations within given optical media, to change the optical characteristics of those locations. Other transformations of physical media are possible without departing from the scope of the present description, with the foregoing examples provided only to facilitate this discussion.

Figure 3:
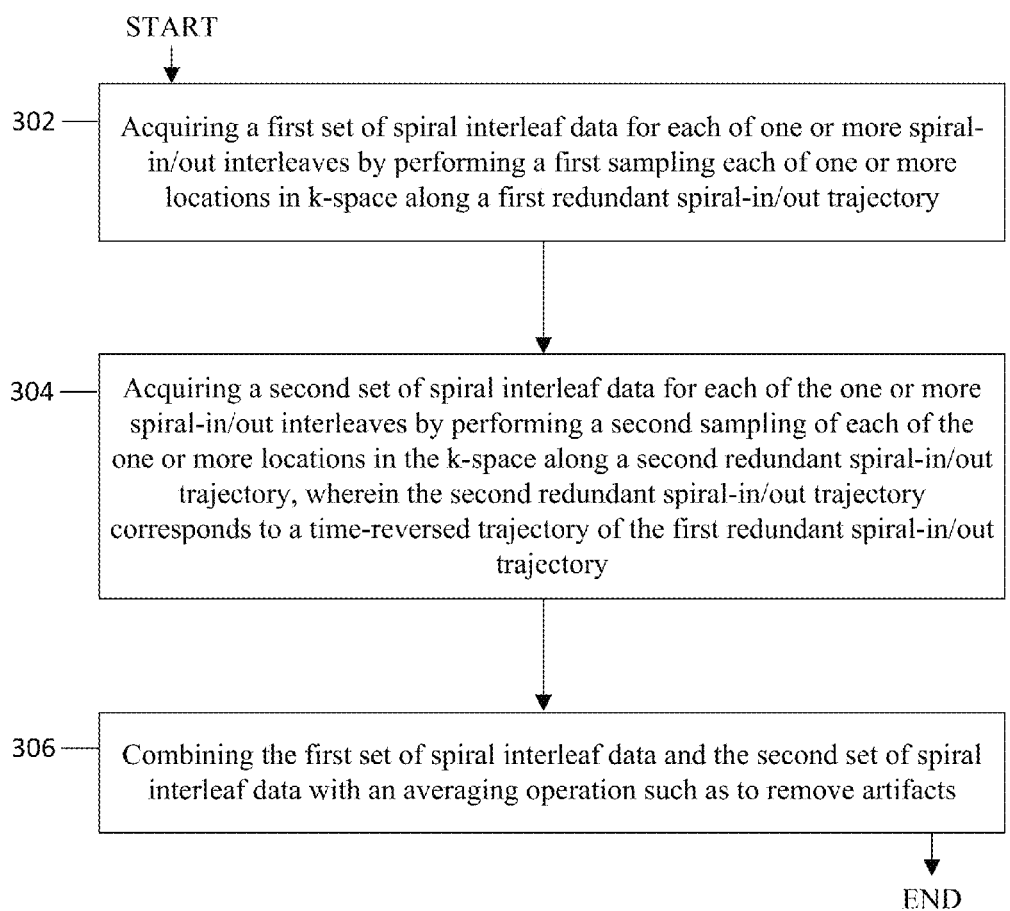
FIG. 3 is a flow chart illustrating operations of a method for acquiring magnetic resonance imaging (MRI) data, in accordance with one example embodiment of the present disclosure.

FIG. 3 is a flow chart illustrating operations of a method 300 of acquiring magnetic resonance imaging data, in accordance with one example embodiment of the present disclosure. The method 300 begins at block 302, and according to an example embodiment, includes acquiring a first set of spiral interleaf data for each of one or more spiral-in/out interleaves by performing a first sampling each of one or more locations in k-space along a first redundant spiral-in/out trajectory. At block 304, the method includes acquiring a second set of spiral interleaf data for each of the one or more spiral-in/out interleaves by performing a second sampling of each of the one or more locations in the k-space along a second redundant spiral-in/out trajectory. The second redundant spiral-in/out trajectory corresponds to a time-reversed trajectory of the first redundant spiral-in/out trajectory. At block 306, the method includes combining the first set of spiral interleaf data and the second set of spiral interleaf data with an averaging operation such as to reduce artifacts. The method 300 ends following block 306.

Spiral k-space trajectories offer many advantages over traditional rectilinear acquisitions, including improved acquisition efficiency, less stringent hardware requirements, and natural resilience to flow and motion [1]. However, a major hurdle to wide-spread adoption of spiral trajectories has been their poor off-resonance performance [2]. Efforts to correct or at least mitigate the resultant blurring and distortion in spiral images in the presence of system non-idealities led to the two-pronged strategy of mitigation and correction in spiral imaging.

First, splitting the acquisition into multiple short interleaves reduces artifacts by ensuring that an undue amount of undesirable phase does not accrue in a single readout. Second, much effort has been expended to correct for off-resonance effects in image reconstruction algorithms. These techniques vary in complexity and computational cost, from a relatively simple center frequency correction and first-order trajectory warping method based on a least-squares fit to an acquired field-map [3], to time-[4] and frequency-segmented approaches [5], to automatic [6, 7] and semi-automatic [8] methods which demodulate the image at multiple frequencies in order to build a composite image free of blurring. Many of these algorithms have become large, requiring several seconds to reconstruct a single image.

Main field inhomogeneity is a primary source of off-resonance in MRI. However, off-resonance also may be caused by other system imperfections besides $B_0$ inhomogeneity. Particularly at lower field strengths and for off-center slices, concomitant fields generated by normal gradient operation may cause noticeable blur in spiral images [9]. With some exceptions [9-11], the blur due to concomitant fields has been largely ignored in the spiral literature, as it requires a more complex model to appropriately address de-blurring.

The most commonly encountered spiral trajectories are "spiral-out". That is, the trajectory begins at the origin of k-space and moves outward along a spiral. These trajectories may be time-reversed ("spiral-in") in order to provide a measure of $T_2^*$-sensitivity to the sequence [12]. Combining the two, such that a spiral-out trajectory arm immediately follows a spiral-in arm, results in the so-called spiral-in/out trajectory. Although this trajectory was first proposed for efficient sampling of spin-echoes for abdominal imaging [13, 14], a version of it has gained popularity in fMRI [15], where its SNR, speed, and resistance to flow artifacts make it an attractive alternative to rectilinear EPI methods. Additionally, it has recently been shown to improve SNR and image quality for real-time spiral bSSFP cardiac imaging due to its natural ability to center TE within TR [16].

For spiral imaging, the amount of undesired phase accrued between when the center of k-space is sampled and when the edge of k-space is sampled determines the severity of the well-known spiral blur. Given a desired resolution, spiral-out and spiral-in/out trajectories require readout lengths of nearly the same duration (within a few percent due to differing amounts of time spent near the center of k-space where the k-space velocity is small). For a given readout length then, a spiral-in/out trajectory requires about half as long to move from the edge of k-space to the center compared to a spiral-out trajectory. It follows that for a fixed readout length and identical TE, spiral-in/out trajectories will have better off-resonance performance than their traditional spiral-out counterparts.

Some embodiments of the disclosed technology may reduce or avoid blurring due to off resonance. The specific origin of off-resonance ($B_0$ or concomitant fields) may be unimportant, as using a redundant spiral-in/out sampling scheme may naturally reduce or remove even severe off-resonance image artifacts during image acquisition, allowing for fast and simple correction methods in the image reconstruction step.

EXAMPLE IMPLEMENTATIONS AND RESULTS

The following describes examples of practicing concepts and technologies presented herein, and corresponding results, in accordance with aspects of the present disclosure.

Example 1

Theory

FIGS. 4A-B illustrate spiral-out and spiral-in/out read gradients, respectively. FIGS. 4C-D illustrate the k-space trajectories for the spiral out and spiral-in/out trajectories, respectively, of FIGS. 4A-B. In an example embodiment, the in/out spiral gradients may be generated by calculating spiral-out gradients, and then time reversing the gradients (including any rewinding lobes) to act as the spiral-in portions of the trajectory. The rewinders 410 then may act as prewinders 420, moving one first to the edge of k-space before data acquisition begins.

Conceptually, spiral-in/out trajectories may be implemented in one of two ways. In the first method, referred to herein as the "non-redundant" scheme, each spiral-out arm may fill in the conjugate k-space location of the spiral-in arm, requiring the same number of interleaves as a spiral-out trajectory for equal k-space coverage. The interleaves may be incremented linearly, such that all of the spiral-in arms begin on one edge of k-space, and all of the spiral-out arms end on the other. Alternatively, the interleaves may be interspersed such that a spiral-out arm brackets each spiral-in arm in order to disperse amplitude and phase mismatches between the two arms across the outer regions of k-space. However, severe artifacts may still occur in multi-shot imaging when there is either a strong amplitude or phase mismatch in the data acquired with the spiral-in and spiral-out portions of the non-redundant spiral-in/out trajectory.

The second method, referred to herein as the "redundant" scheme, may acquire each interleaf twice, once in each direction through k-space (i.e. the redundant scheme may include acquiring two non-redundant trajectories with the second acquisition rotated 180° in k-space). Thus, for a given resolution and field-of-view, the redundant scheme may require twice the number of excitations as its non-redundant counterpart. However, despite this prolongation of scan time, the redundant scheme may be a far more robust acquisition scheme, as each location in k-space may be sampled twice: once with a spiral-in arm and once with a spiral-out arm. The data may be then averaged, either before or after gridding the data onto a Cartesian matrix. Amplitude and phase mismatches between the data acquired with spiral-in and spiral-out arms of the trajectory may therefore be reduced.

To illustrate these ideas, the impact of $T_2$ relaxation during data acquisition on each of the described trajectories is shown in FIG. 5. For the simulations described in this section, the number of interleaves was 14 (28 for redundant in/out trajectory), the field of view was 300 mm, and the total readout duration was 10 ms. Here, a matrix of ones was inverse-gridded with each trajectory, $T_2$ relaxation on the order of readout length was simulated by linearly decreasing the amplitude of the simulated data, and the simulated data was then gridded and displayed on a logarithmic scale. For spiral-out imaging, $T_2$ relaxation may result in a windowing of the data, with higher frequencies losing signal. For non-redundant spiral-in/out imaging, the appearance of the k-space weighting, and thus the appearance of image artifacts, may depend on whether the interleaves are incremented linearly, or whether they are designed such that each spiral-in arm is bracketed by a spiral-out arm (here called interleaved-ordering). Finally, it can be seen that redundant spiral-in/out sampling smoothes these amplitude differences, resulting in a flat frequency response. For this figure, $T_2$ relaxation is shown only due to the ease in visualizing magnitude differences in the data; the theory extends to phase differences, which are discussed more fully next.

Redundant Trajectory Response to System Non-Idealities: $B_0$ Off-Resonance

Point-spread-functions (PSFs) were simulated for spiral-out, non-redundant in/out, and redundant in/out trajectories, both with and without off-resonance (FIG. 3). PSFs were simulated by performing a gridding-and-FFT reconstruction on a matrix of ones. Off-resonance was added by linearly increasing the phase of the simulated data. Moderate off-resonance with spiral-out trajectories may cause a well-known broadening of the main PSF lobe due to undesired phase accrual during the spiral readout, while in non-redundant spiral-in/out, little broadening of the PSF main lobe may be observed However, strong rings may be caused by the phase mismatch (due to off-resonance) between the spiral-in and spiral-out arms. These locations of these rings may depend on the number of interleaves being used, and they may occur further away from the main lobe with fewer interleaves. Redundant scanning may reduce or remove these rings through phase cancellation and leave the narrow main lobe, resulting in an excellent PSF for spiral imaging.

To understand the origin of this effect, the signal equation of a spiral-in/out trajectory in the presence of $B_0$ inhomogeneity will be examined. Ignoring relaxation, the classic demodulated signal equation in MRI is $$s(t) = \int m(r) e^{-j2\pi k(t)r} e^{-j\omega(r)\tau(t)} dr, \quad [1]$$

where m(r) is the signal, k(t) the k-space trajectory, and ω(r) the off-resonance. For the time being, For now, let the off-resonance phase-accrual time parameter τ(t)=t, since phase accrues proportionally to time for $B_0$ off-resonance. For phase accrual due to concomitant fields, τ(t) is more complex, and the concomitant field case will be addressed in the next subsection.

It can be shown (Appendix A) that the signal resulting from the averaging of the data from a redundant spiral-in/out trajectory is:

$$s(t) = \int m(r) e^{-j2\pi k(t)r} [\cos \omega(r) t] dr. \quad [2]$$

For small-to-moderate off-resonance values, Eq. 2 shows that the signal experiences a relatively benign cosine amplitude modulation of the signal rather than the more serious phase modulation that arises with spiral-out trajectories in the presence of off-resonance.

Figure 7A:
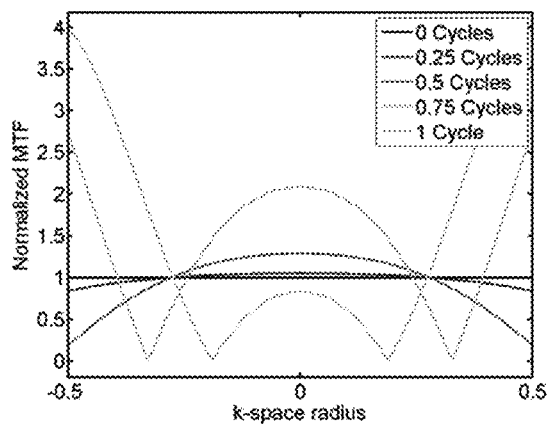
FIGS. 7A-C illustrate normalized modulation transfer functions (MTFs) of spiral-in/out trajectories, in accordance with one example embodiment of the present disclosure. The MTFs were normalized to on-resonance (0 cycles) case.

FIG. 7A shows simulated normalized modulation transfer functions (MTFs) for various amounts phase accumulated by the end of the readout (corresponding to the off-resonance-time product in Eq. 2) for the redundant spiral-in/out trajectory. For redundant in/out sampling, there may be two regimes under which the shape of the MTF may fall. In the first regime, the number of accumulated cycles may be small, either because there is not much off-resonance present, or because the readout length is short. In this regime, the cosine modulation may never reach its first zero point during the readout, so the signal may experience a windowing function which only slightly attenuates high-frequency components, resulting in a slight blurring. This residual blurring may be much less than the blurring associated with a comparable spiral-out scan. In the second regime, when the value of the off-resonance-time product is high, the cosine modulation may begin nulling important frequencies as a function of k-space radius, resulting in image artifacts. FIG. 7A shows the redundant spiral-in/out method will work well as long as the number of cycles of phase remains less than 0.5. For a 10 ms readout, this is 50 Hz. This amount of off-resonance may be easily achieved during normal operation of clinical-strength scanners, so first-order correction may be performed on the data/trajectories prior to gridding in order to quickly correct gross off-resonance.

Concomitant Gradient Effects

Returning to the case where phase accrual is due to concomitant field effects, it may be shown that $\omega_c(r)$ is a complex function of the imaging gradients and spatial coordinates of the slice, the actual form of which is unimportant for this case. As mentioned previously, in this case the phase-accrual time function may take a more complex form. Specifically, $$\tau(t) = \frac{1}{g_m^2} \int_0^t [G_x^2(t') + G_y^2(t')]dt', \qquad [3]$$

where $g_m^2$ is the maximum gradient strength reached during the scan, and $G_x(t')$ and $G_y(t')$ are the spiral gradients on the two in-plane axes [9]. Because this time function may depend on the gradients-squared and because the spiral-in/out gradients are symmetric, it is easy to see that $\tau(-t)=-\tau(t)$ and the same steps of the derivation outlined in Appendix A may be followed to find that the signal in the presence of concomitant gradient effects is $$s(t) = \int m(r)e^{-j2\pi k(t)r}[\cos \omega_c(r)\tau(t)]dr. \qquad [4]$$

Figure 7B:
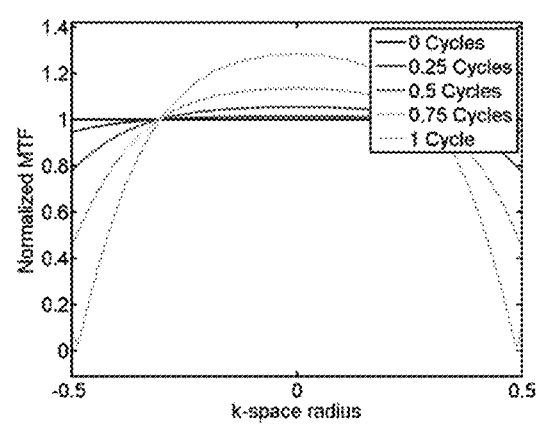

The typical phase-accrual time function for spiral gradients is, overall, less steep than the linear function that governs $B_0$ off-resonance [11]. Thus, the redundant in/out scheme may be actually more robust to phase errors caused by concomitant fields than it is to those cause by $B_0$ inhomogeneity, and may perform well up to about 1 cycle of accrued phase (FIG. 7B).

Relaxation

Thus far, relaxation effects during the readout period have been ignored. In non-redundant multi-shot spiral-in/out scanning, $T_2$ relaxation during the readout may result in stronger signal at one side of the periphery of k-space than the other due to an amplitude mismatch between the beginning of the readout and the end (FIG. 5), the result of which is artifacts that look strikingly similar to those caused by off-resonance. By adding a $T_2$ decay term to Eq. 1 and assuming that the readout time is short compared to $T_2$, one may arrive at the following expression for the signal in the presence of both off-resonance and $T_2$ decay (see Appendix B for this derivation):

$$s(t) = \qquad [5]$$
$$\int m(r)e^{-j2\pi k(t)r}[\cos\omega(r)t]dr + j\int m(r)e^{-j2\pi k(t)r}\frac{t}{T_2(r)}[\sin\omega(r)t]dr.$$

This signal is complex, with a real part corresponding to the familiar cosine-modulated signal equation and an imaginary part that varies in amplitude with time. This could be potentially worrisome, since phase cancellation may be relied upon to reduce or remove off-resonance effects. At least two facts ameliorate the situation: First, remembering that time runs from $-T/2$ to $T/2$ and noting that at $t=0$, the imaginary component drops out. It follows that, at the center of k-space where the majority of the image energy resides, there is little impact from the imaginary component of Eq. 5. Second, the ratio of $t/T_2(r)$ that controls the amplitude of the imaginary component may always be small as long as $T_2$ is larger than $t_{max}$, which should often be the case for physiologic relaxation values and readout lengths. However, problems may arise in the case of gradient-echo imaging of short $T_2^*$ species.

If no off-resonance is assumed (or that off-resonance is corrected somehow) and set $\omega(r)=0$, it can be seen that the averaging operation in redundant sampling may work to reduce or remove $T_2$-induced artifacts in redundant sampling. In truth, even if the linear approximation utilized in the derivation is relaxed (as could be necessary for a gradient-echo scan to account for $T_2^*$ decay), it is easy to visualize that in redundant sampling there may be a symmetric emphasis on the outer regions of k-space, the result of which may be more benign than the asymmetric $T_2$ weighting that occurs for non-redundant spiral-in/out trajectories.

Figure 7C:
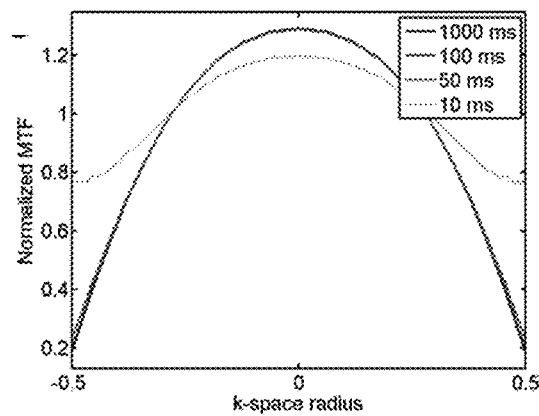

In simulations, the combination of $T_2$ and off-resonance may not be too different from either case alone. FIG. 7C shows the performance of the redundant method in the presence of both inhomogeneity and $T_2$ relaxation in terms of the MTF. As expected, strong shaping of the MTF only occurs for $T_2$ on the order of readout length (10 ms). However, even at this extremely short $T_2$, there is little degradation of the PSF (not shown). The imaginary term in Eq. 5, and thus potentially damaging phase due to $T_2$ relaxation, may be negligible.

Figure 8:
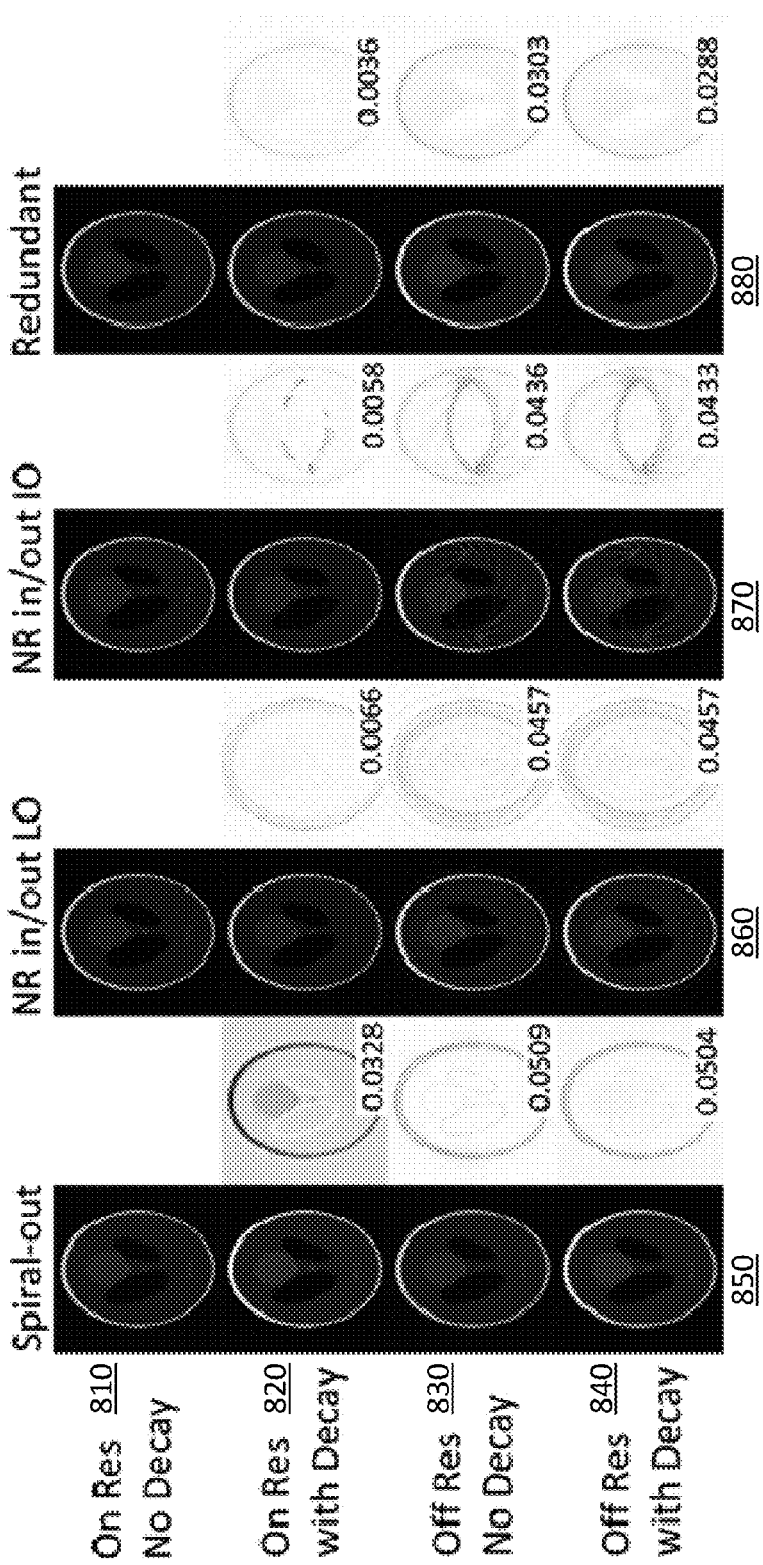
FIG. 8 illustrates reconstructions of numerical phantom inverse-gridded with spiral-out, linear ordering non-redundant, interleaved ordering redundant, and redundant trajectories, in accordance with one example embodiment of the present disclosure. Two non-redundant (NR) trajectories were included in this simulation. For linear ordering (LO), all spiral-in arms were clustered (see FIG. 5A). In interleaved ordering (IO) (see FIG. 5B), each spiral-in arm is surrounded by a spiral-out arm. Difference images are versus ideal (On Resonance, No Decay) image and color-inverted for ease of visualization. The row 2 difference is x5; all others are x1. The number of interleaves=15 for spiral-out and both non-redundant trajectories, 30 for redundant. The numbers in bottom right of the difference images indicate RMSE versus ideal image.

To demonstrate these ideas and wrap up this subsection, FIG. 8 shows the improved performance of the redundant in/out trajectory 880 versus spiral-out 850 and non-redundant spiral in/out trajectories 860, 870 in a numerical phantom which was first inverse-gridded, then had either simulated $T_2$ decay 820, moderate off-resonance 830, or both 840 applied, then reconstructed normally. (The row at 810 shows the control with no off-resonance or decay.) For all parameters, the redundant in/out trajectory may out-perform the spiral-out and non-redundant in/out trajectories in terms of RMSE.

Though the redundant spiral-in/out trajectory may work for both gradient-echo and spin-echo imaging, spin-echoes provide a natural setting in which to apply them. Since the TE of spin-echo scans is generally longer, the spiral-in portion of the trajectory may be inserted with little or no increase in minimum TE. Second, the in/out trajectory may align the gradient echo generated by the spiral gradients with the spin echo formed by the RF pulses at the center of the gradient waveform, resulting in higher signal when the center of k-space is sampled.

Simple spin-echo sequences are rarely used today, as their faster TSE-type cousins are capable of generating similar contrast in a fraction of the time. One attractive application for the redundant spiral-in/out trajectory may be a slab-selective version of the 3D spiral TSE sequence [17]. In this sequence, multiple averages with RF chopping are used to reduce or remove spurious echo artifacts that arise from imperfect refocusing pulses in the echo train. Since the origins of the spurious echo artifacts and the spiral-in/out artifacts are different, the second, redundant acquisition may be combined with the RF-chopped acquisition to acquire a fully redundant trajectory with no increase in scan time.

Methods

A resolution phantom was scanned on a 1.5 T Siemens Avanto scanner with a gradient-echo spiral sequence with a spiral-out trajectory and a redundant spiral-in/out trajectory. Acquisition parameters were: number of interleaves—14 (28 for spiral-in/out), spiral duration—10 ms, in-plane FOV—300 mm, slice thickness—5.0 mm. To examine off-resonance performance, the sequences were run once with a good shim applied, and again with the receive frequency manually tuned 20, 40, 80, and 160 Hz off-resonance (corresponding to 0, 0.2, 0.4, 0.8, and 1.6 cycles of off-resonance accumulated at the end of the readout). All images were acquired in the transverse plane, and were gridded and Fourier-transform-reconstructed with no off-resonance correction applied in reconstruction. The gridding operation automatically sums the data at the proper k-space locations, given the redundant trajectories.

To investigate concomitant field performance, the resolution phantom was imaged again with both spiral-out and spiral-in/out trajectories with 14 interleaves (28 for spiral-in/out), spiral duration 6.4 ms, in-plane FOV 300 mm, and slice thickness 3 mm in a double-oblique orientation ((C→S −41.8°)→−27.8° near the magnet isocenter (X −9.8 mm, Y −39.6 mm, Z −21.7 mm), then moved 50 mm along the z-axis (X −9.8 mm, Y −39.6 mm, Z −71.7 mm) and imaged again to ensure significant concomitant fields.

To test whether the redundant trajectory can be acquired concurrent with the second, RF-chopped average of a TSE sequence, a resolution phantom was scanned on a 3T Siemens Trio scanner with a slab-selective 3D stack-of-spirals TSE sequence with a spiral-out trajectory (2 averages required), a spiral-in/out trajectory in which the redundant interleaves are acquired in separate chopped scans (4 averages required), and a spiral-in/out trajectory which combines the redundant interleaf scan with the chopped scan (2 averages required). Acquisition parameters were: spiral duration 6.4 ms, in-plane FOV 300 mm, number of slices=32, slice thickness 1.0 mm. Averages were combined after linear off-resonance correction was applied to the k-space trajectories and after gridding the data separately.

To test the redundant in/out trajectory in vivo, a slab-selective version of the variable-flip-angle 3D spiral TSE (spiral SPACE) sequence was used on a normal volunteer for $T_2$-weighted brain imaging. Scan parameters were: TR/TE 3000/200, spiral duration 6.4 ms, in-plane FOV 250 mm, number of slices=64, slice thickness 1.0 mm. Forty-nine interleaves were used for both spiral-out and spiral-in/out acquisitions. For spiral-in/out, the second, redundant interleaf scan was combined with the chopped scan so that the total acquisition time for both sequence variations was identical. No off-resonance correction algorithm was applied in reconstruction in order to better exhibit the improved off-resonance performance of the redundant in/out sequence.

Results

The redundant spiral-in/out trajectory shows improved robustness for off-resonance values ranging up to 0.5 cycles (FIG. 9). Above this value, blurring appears and is comparable to a spiral-out scan performed with half the amount of off-resonance applied, which is consistent with the time elapsed between when the center and edges of k-space are acquired being half that for a spiral-in/out trajectory. Furthermore, the increase in SNR is apparent in FIG. 9 for the in/out scan due to averaging of the redundant data.

FIG. 10 shows the spiral-out and spiral-in/out trajectories for double-oblique imaging planes near the magnet isocenter and off-center. The spiral-in/out trajectory results in images largely free from blurring due to concomitant fields.

FIG. 11 shows that the redundant trajectory acquisition can be combined with an RF-chopped second average in slab-selective spin echo train imaging to gain the benefits of the redundant trajectory with no increase in scan time. One slice is shown from a 3D volume.

Figure 12A:
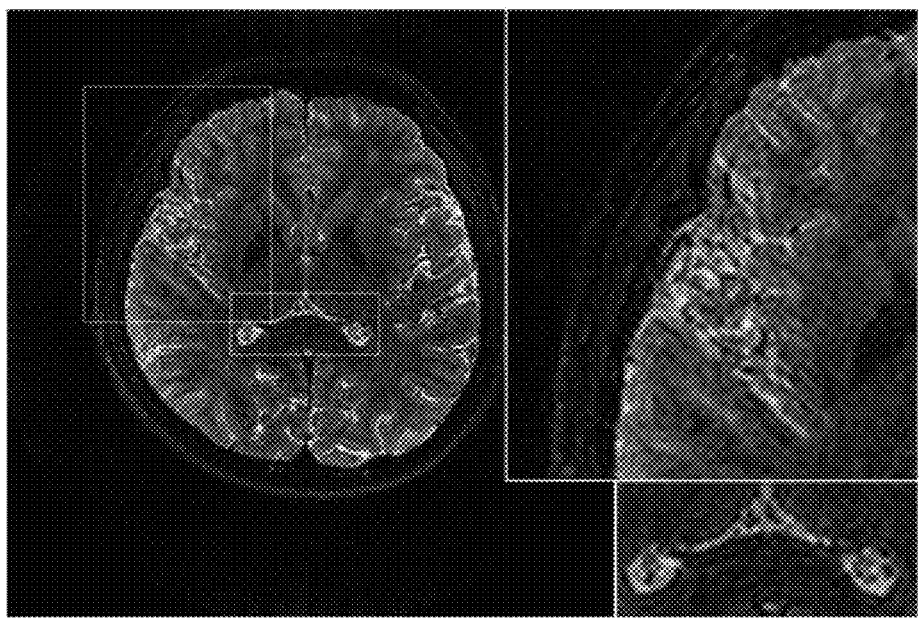
FIGS. 12A-B illustrate spiral out and redundant spiral-in/out acquisitions, respectively, in a volunteer with no off-resonance correction applied.
Figure 12B:
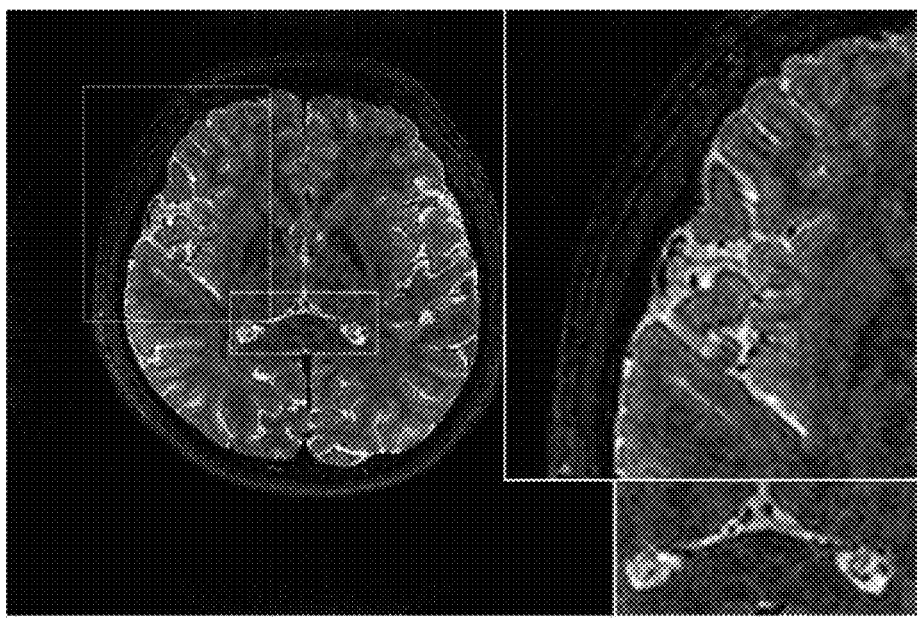

One slice from a 3D stack-of-spirals TSE in vivo dataset acquired with both spiral trajectories is shown in FIG. 12. Contrast is slightly different between the sequences because the spiral-out version begins spiraling out from the k-space origin before the spin-echo has formed, whereas the spiral-in/out centers the acquisition of the center of k-space on the spin echo. Overall, the images acquired with the spiral-in/out trajectory are sharper, and in regions of high $B_0$ inhomogeneity, show much improved off-resonance performance.

FIG. 13 shows vessel sharpness improvement when the redundant in/out trajectory is used for non-contrast MRA. As before, when combined with slab selection and RF chopping, this improvement is gained with no increase in scan time.

Discussion and Conclusion

Although all of the data presented here was performed with a single receive channel, it is anticipated this technique will perform well in parallel imaging implementations, allowing fast reconstructions to take place at scan time. The complexity and reconstruction time for non-Cartesian parallel reconstructions (which, in addition to removing non-Cartesian aliasing artifacts, have had to address the off-resonance issue) has been a major hurdle in their development.

For small values of off-resonance, the k-space signal in redundant sampling may experience a cosine amplitude window, which is a different (and more benign) mechanism for resolution loss compared to the PSF broadening observed in spiral-out scanning. However, as in regular spiral imaging, this slight blurring may be space-variant depending on local off-resonance values. For larger off-resonance values (or for long readout lengths), the cosine modulation may begin nulling important frequencies in k-space as a function of k-space radius, resulting in more severe image artifacts. Here, it is proposed to get close to the true off-resonance field through an acquired field map and subsequent linear estimation of the field. As long as the maximum deviation from this estimate is relatively small, the redundant spiral-in/out method may reduce or remove the majority of blur due to residual off-resonance. As is the case for traditional spiral-out imaging, highly inhomogeneous fields will limit redundant spiral-in/out scanning to short readout durations.

The fact that the redundant spiral-in/out trajectory necessarily requires twice the number of interleaves as a spiral-out trajectory to achieve a similar resolution cannot be overlooked. It has been shown here that for slab-selective 3D spiral TSE imaging, at least, the redundant acquisition may be combined with the RF-chopped second average with no penalty in scan time. The spiral-in/out trajectory is a natural method for spin-echo and TSE sequences since it aligns the gradient echo with the spin echo. For other cases where spiral trajectories are regularly used with multiple averages (e.g. fMRI, ASL), redundant in/out trajectories can be used with no overall increase in scan time.

The redundant spiral-in/out trajectory may bear a similarity to the prevailing spiral-in/out trajectory used in fMRI, wherein the trajectory spirals out along the same path as the spiral-in portion [18, 19]. However, typically, fMRI scans are performed with few interleaves (often single-shot), and the spiral-in and spiral-out data is reconstructed separately, then adaptively combined on a pixel-by-pixel basis [18, 20]. The trajectories used in fMRI then, may be redundant, but they do not adhere to the mirror-symmetry requirement of Eq. A.3. Thus, the signal equations derived in this paper may not necessarily apply in the same manner to this class of spiral-in/out trajectory.

Appendix A

For redundant spiral-in/out trajectories, a few properties of the k-space trajectory may be defined:

$$t \in [-T/2, T/2] \qquad [A.1]$$

$$k_2(t) = k_1(-t) = -k_1(t) \qquad [A.2]$$

That is, the two trajectories are symmetric about the origin and they are mirror images of one another. Inserting this into Eq. 1 and taking $\tau(t)=t$, the corresponding signal equations are:

$$s_1(t) = \int_{-T/2}^{T/2} m(r) e^{-j2\pi k_1(t)r} e^{-j\omega(r)t} dr \quad [A.3]$$

$$s_2(t') = \int_{-T/2}^{T/2} m(r) e^{-j2\pi k_2(t')r} e^{-j\omega(r)t'} dr \quad [A.4]$$

$$= \int_{-T/2}^{T/2} m(r) e^{+j2\pi k_1(t')r} e^{-j\omega(r)t'} dr$$

However, the second acquisition is run in the opposite direction through k-space, so $s_2(t)$ should be time-reversed. Let $t=-t'$.

$$s_2(t) = \int_{-T/2}^{T/2} m(r) e^{+j2\pi k_2(-t)r} e^{-j\omega(r)(-t)} dr \quad [A.5]$$

$$= \int_{-T/2}^{T/2} m(r) e^{-j2\pi k_1(t)r} e^{+j\omega(r)t} dr$$

Finally, the signals may be combined via simple averaging.

$$s(t) = \frac{1}{2}[s_1(t) + s_2(t)] \quad [A.6]$$

$$= \frac{1}{2} \int_{-T/2}^{T/2} m(r) e^{-j2\pi k_1(t)r} [e^{-j\omega(r)t} + e^{+j\omega(r)t}] dr$$

$$= \frac{1}{2} \int_{-T/2}^{T/2} m(r) e^{-j2\pi k_1(t)r} [\cos\omega(r)t] dr$$

In all other sections of this manuscript, the integral limits $[-T/2,T/2]$ are taken to be understood.

Appendix B

Starting again with Eqs. A.4 and A.6 and insert a $T_2$ decay term, $$s_1(t) = \int m(r) e^{-j2\pi k_1(t)r} e^{-j\omega(r)t} e^{-t/T_2(r)} dr \quad [B.1]$$

$$s_2(t) = \int m(r) e^{-j2\pi k_1(t)r} e^{+j\omega(r)t} e^{+t/T_2(r)} dr \quad [B.2]$$

The combined signal is therefore, $$s(t) = \frac{1}{2} \int m(r) e^{-j2\pi k_1(t)r} [e^{-t/T_2(r)} e^{-j\omega(r)t} + e^{+t/T_2(r)} e^{+j\omega(r)t}] dr \quad [B.3]$$

For physiologic relaxation values and the time scales that readouts are performed at, $T_2$ decay is approximately linear (for example, even a severe $T_2$ value of 10 ms may only result in a 13% deviation from linearity over a 10 ms readout). One can therefore estimate $e^{t/T_2(r)} \approx 1+t/T_2(r)$ and $e^{-t/T_2(r)} \approx 1-t/T_2(r)$ to arrive at Eq. 5:

$$s(t) = \frac{1}{2} \int m(r) e^{-j2\pi k_1(t)r} [(1-t/T_2(r)) e^{-j\omega(r)t} + (1+t/T_2(r)) e^{+j\omega(r)t}] dr$$

$$= \frac{1}{2} \int m(r) e^{-j2\pi k_1(t)r} \left[ (e^{-j\omega(r)t} + e^{+j\omega(r)t}) - \frac{t}{T_2(r)} (e^{-j\omega(r)t} - e^{+j\omega(r)t}) \right] dr$$

$$= \int m(r) e^{-j2\pi k_1(t)r} \left\{ \cos[\omega(r)t] + j\frac{t}{T_2(r)} \sin[\omega(r)t] \right\} dr$$

$$= \int m(r) e^{-j2\pi k_1(t)r} \cos[\omega(r)t] dr +$$

$$j\frac{t}{T_2(r)} \int m(r) e^{-j2\pi k_1(t)r} \sin[\omega(r)t] dr \quad [B.4]$$

The specific configurations, choice of materials and chemicals, and the size and shape of various elements can be varied according to particular design specifications or constraints requiring a system or method constructed according to the principles of the present disclosure. For example, while certain example ranges have been provided for the search windows and patch sizes, for example, other resolutions could be used depending on the application and the desired final image resolution. Such changes are intended to be embraced within the scope of the present disclosure. The presently disclosed embodiments, therefore, are considered in all respects to be illustrative and not restrictive. The scope of the present disclosure is indicated by the appended claims, rather than the foregoing description, and all changes that come within the meaning and range of equivalents thereof are intended to be embraced therein.

LIST OF REFERENCES

1. Delattre B M A, Heidemann R M, Crowe L A, Valleée J P, Hyacinthe J N. Spiral demystified. Magn Reson Imaging 2010; 28:862-881.
[2] Bernstein M A, King K F, Zhou X J. Handbook of MRI Pulse Sequences. Boston: Elsevier Academic; 2004.
[3] Irarrazabal P, Meyer C H, Nishimura D G, Macovski A Inhomogeneity correction using an estimated linear field map. Magn Reson Med 1996; 35:278-282.
[4] Noll D C, Meyer C H, Pauly J M, Nishimura D G, Macovski A. A homogeneity correction method for magnetic resonance imaging with time-varying gradients. IEEE T Med Imaging 1991; 10:629-637.
[5] Man L C, Pauly J M, Macovski A. Multifrequency interpolation for fast off-resonance correction. Magn Reson Med 1997; 37:785-792.
[6] Noll D C, Pauly J M, Meyer C H, Nishimura D G, Macovski A, Deblurring for non-2D Fourier transform magnetic resonance imaging. Magn Reson Med 1992; 25:319-333.
[7] Man L C, Pauly J M, Macovski A. Improved automatic off-resonance correction without a field map in spiral imaging. Magn Reson Med 1997; 37:906-913.
[8] Chen W, Meyer C H. Semiautomatic off-resonance correction in spiral imaging. Magn Reson Med 2008; 59:1212-1219.
[9] King K F, Ganin A, Zhou X J, Bernstein M A, Concomitant gradient field effects in spiral scans. Magn Reson Med, 1999; 41:103-112.
[10] Chen W, Sica C T, Meyer C H. Fast conjugate phase image reconstruction based on a Chebyshev approximation to correct for B0 field inhomogeneity and concomitant gradients. Magn Reson Med 2008; 60:1104-1111.
[11] Sica C T. Concomitant gradient field effects in spiral scanning and balanced SSFP scanning PhD thesis, University of Virginia, 2008.

[12] Börnert P, Aldefeld B, Eggers H. Reversed spiral MR imaging. Magn Reson Med 2000; 44:479-484.
[13] Meyer C H, inventor. The Board of Trustees of the Leland Stanford Junior University, assignee. Full echo spiral-in/spiral-out magnetic resonance imaging. U.S. Pat. No. 5,650,723. Jul. 22, 1997.
[14] Meyer C H. Rapid Magnetic Resonance Imaging. PhD thesis, Stanford University, 2000.
[15] Glover G H. Spiral Imaging in fMRI. NeuroImage 2012; 62:706-712.
[16] Feng X, Salerno M, Kramer C M, Meyer C H. Comparison among radial, spiral-out & spiral-in/out bSSFP in real time cardiac imaging. In Proceedings of 19th Annual Meeting of ISMRM, Stockholm, Sweden, 2011. P 2620.
[17] Fielden S W, Meyer C H, Mugler J P, III. Variable-flip angle 3D-turbo spin echo imaging utilizing spiral acquisitions. In Proceedings of the 19th Annual Meeting of ISMRM, Stockholm, Sweden, 2011. p. 2820.
[18] Glover G H, Law C S. Spiral-in/out BOLD fMRI for increased SNR and reduced susceptibility artifacts. Magn Reson Med 2001; 46:515-522.
[19] Preston A R, Thomason M E, Ochsner K N, Cooper J C, Glover G H. Comparison of spiral-in/out and spiral-out BOLD fMRI at 1.5 and 3 T. NeuroImage 2004; 21:291-301.
[20] Glover G H, Thomason M E. Improved combination of spiral-in/out images for BOLD fMRI. Magn Reson Med 2004; 51:863-868.

What is claimed is:

1. A method, comprising:
   acquiring magnetic resonance imaging (MRI) data associated with an area of interest of a subject, comprising:
      acquiring a first set of spiral interleaf data for each of one or more spiral-in/out interleaves by performing a first sampling of each of one or more locations in k-space along a first redundant spiral-in/out trajectory,
      acquiring a second set of spiral interleaf data for each of the one or more spiral-in/out interleaves by performing a second sampling of each of the one or more locations in the k-space along a second redundant spiral-in/out trajectory,
      wherein the second redundant spiral-in/out trajectory corresponds to a time-reversed trajectory of the first redundant spiral-in/out trajectory, and
      combining the first set of spiral interleaf data and the second set of spiral interleaf data with an averaging operation such as to reduce artifacts.

2. The method of claim 1, wherein the first and second redundant trajectories are symmetric about an origin of the k-space.

3. The method of claim 1, wherein the first and second redundant trajectories are mirror images of one another.

4. The method of claim 1, wherein the artifacts that are removed by the averaging operation are caused at least by one or more of main field inhomogeneity, concomitant gradient fields and T2 decay.

5. The method of claim 1, wherein the first acquired spiral interleaf data is averaged before gridding the first set of acquired spiral data onto a Cartesian matrix.

6. The method of claim 1, wherein the first acquired spiral interleaf data is averaged after gridding the first set of acquired spiral data onto a Cartesian matrix.

7. The method of claim 1, wherein the number of spiral-in/out interleaves is one.

8. The method of claim 1, wherein acquiring the MRI data comprises slab-selective multi-dimensional spiral turbo spin echo (TSE) sampling.

9. A system, comprising:
   a magnetic resonance imaging (MRI) device;
   one or more processors; and
   at least one memory device in communication with the MRI device, storing computer-readable instructions that, when executed by the one or more processors, cause the system to:
      acquire magnetic resonance imaging (MRI) data associated with an area of interest of a subject, by:
         acquiring, by the MRI device, a first set of spiral interleaf data for each of one or more spiral-in/out interleaves by performing a first sampling of each of one or more locations in k-space along a first redundant spiral-in/out trajectory,
         acquiring a second set of spiral interleaf data for each of the one or more spiral-in/out interleaves by performing a second sampling of each of the one or more locations in the k-space along a second redundant spiral-in/out trajectory,
         wherein the second redundant spiral-in/out trajectory corresponds to a time-reversed trajectory of the first redundant spiral-in/out trajectory, and
         combining, by the one or more processors, the first set of spiral interleaf data and the second set of spiral interleaf data with an averaging operation such as to reduce artifacts.

10. The system of claim 9, wherein the first and second redundant trajectories are symmetric about an origin of the k-space.

11. The system of claim 9, wherein the first and second redundant trajectories are mirror images of one another.

12. The system of claim 9, wherein the artifacts that are removed by the averaging operation are caused at least by one or more of main field inhomogeneity, concomitant gradient fields and T2 decay.

13. The system of claim 9, wherein the first acquired spiral interleaf data is averaged before gridding the first acquired spiral data onto a Cartesian matrix.

14. The system of claim 9, wherein the first acquired spiral interleaf data is averaged after gridding the first acquired spiral data onto a Cartesian matrix.

15. The system of claim 9, wherein the number of spiral-in/out interleaves is one.

16. The system of claim 9, wherein acquiring the MRI data comprises slab-selective multi-dimensional spiral turbo spin echo (TSE) sampling.

17. A computer-readable storage medium having stored computer-executable instructions that, when executed by one or more processors, cause a computer to perform functions comprising:
    acquiring magnetic resonance imaging (MRI) data associated with an area of interest of a subject, comprising:
       acquiring a first set of spiral interleaf data for each of one or more spiral-in/out interleaves by performing a first sampling of each of one or more locations in k-space along a first redundant spiral-in/out trajectory,
       acquiring a second set of spiral interleaf data for each of the one or more spiral-in/out interleaves by performing a second sampling of each of the one or more locations in the k-space along a second redundant spiral-in/out trajectory,
       wherein the second redundant spiral-in/out trajectory corresponds to a time-reversed trajectory of the first redundant spiral-in/out trajectory, and
       combining the first set of spiral interleaf data and the second set of spiral interleaf data with an averaging operation such as to reduce artifacts.

18. The computer-readable storage medium of claim 17, wherein the first and second redundant trajectories are symmetric about an origin of the k-space.

19. The computer-readable storage medium of claim 17, wherein the first and second redundant trajectories are mirror images of one another.

20. The computer-readable storage medium of claim 17, wherein the artifacts that are removed by the averaging operation are caused at least by one or more of main field inhomogeneity, concomitant gradient fields and T2 decay.

21. The computer-readable storage medium of claim 17, wherein the first acquired spiral interleaf data is averaged before gridding the first set of acquired spiral data onto a Cartesian matrix.

22. The computer-readable storage medium of claim 17, wherein the first acquired spiral interleaf data is averaged after gridding the first set of acquired spiral data onto a Cartesian matrix.

23. The computer-readable storage medium of claim 17, wherein the number of spiral-in/out interleaves is one.

24. The computer-readable storage medium of claim 17, wherein acquiring the MRI data comprises slab-selective multi-dimensional spiral turbo spin echo (TSE) sampling.

* * * * *